US007470881B2

(12) United States Patent  
Oda (10) Patent No.: US 7,470,881 B2  
(45) Date of Patent: Dec. 30, 2008

(54) SOLID-STATE IMAGING DEVICE INCLUDING PLURAL GROUPS OF PHOTOELECTRIC CONVERSION DEVICES WITH PLURAL MICROLENSES BEING SHIFTED IN A PERIPHERAL PORTION OF THE IMAGING DEVICE, AND IMAGING APPARATUS INCLUDING THE IMAGING DEVICE

(75) Inventor: Kazuya Oda, Saitama (JP)

(73) Assignee: Fujifilm Corporation, Minato-ku, Tokyo (JP)

( * ) Notice: Subject to any disclaimer, the term of this patent is extended or adjusted under 35 U.S.C. 154(b) by 0 days.

(21) Appl. No.: 11/185,761

(22) Filed: Jul. 21, 2005

(65) Prior Publication Data

US 2006/0016961 A1   Jan. 26, 2006

(30) Foreign Application Priority Data

Jul. 21, 2004 (JP) ............. P. 2004-212630
Feb. 2, 2005 (JP) ............. P. 2005-026305

(51) Int. Cl.
*H01L 27/00* (2006.01)

(52) U.S. Cl. ............................ 250/208.1; 250/226
(58) Field of Classification Search .......... 250/226, 250/208.1, 216; 257/294, 440, 432; 359/619, 359/622; 348/264, 265, 272, 340, 294
See application file for complete search history.

(56) References Cited

U.S. PATENT DOCUMENTS 5,986,704 A * 11/1999 Asai et al. ............. 348/340
6,008,511 A * 12/1999 Tokumitsu et al. ....... 257/232
6,518,640 B2 * 2/2003 Suzuki et al. ........... 257/432
6,597,399 B2 * 7/2003 Horii .................... 348/308
2002/0113195 A1 * 8/2002 Osada .................. 250/208.1
2004/0159774 A1 * 8/2004 Mishina et al. ......... 250/208.1
2004/0202381 A1 * 10/2004 Kitajima ................ 382/275
2005/0061951 A1 * 3/2005 Campbell et al. ....... 250/208.1

FOREIGN PATENT DOCUMENTS

JP        10-229180        8/1998
JP        2002-170944      6/2002

OTHER PUBLICATIONS

"New honeycomb "Super CCD" from FujiFilm", Oct. 20, 1999, http://www.dpreview.com/news/9910/99102003superccd.asp.*

* cited by examiner

*Primary Examiner*—Que T Le
(74) *Attorney, Agent, or Firm*—McGinn IP Law Group, PLLC (57) ABSTRACT

A solid-state imaging device includes: plural kinds of groups of photoelectric conversion devices, the solid-state imaging device being so constructed that a difference between an amount of light incident to each photoelectric conversion device in a peripheral portion and an amount of light incident to each photoelectric conversion device in a central portion decreases, wherein the plural kinds of groups each comprises at least one row of photoelectric conversion devices arrayed in a row direction on a semiconductor substrate and any of the plural kinds of groups are so constructed that the difference is reduced to a minimum depending on an incident angle at which light is incident to the peripheral portion of the solid-state imaging device.

21 Claims, 5 Drawing Sheets

SOLID-STATE IMAGING DEVICE INCLUDING PLURAL GROUPS OF PHOTOELECTRIC CONVERSION DEVICES WITH PLURAL MICROLENSES BEING SHIFTED IN A PERIPHERAL PORTION OF THE IMAGING DEVICE, AND IMAGING APPARATUS INCLUDING THE IMAGING DEVICE

This application is based on Japanese Patent application JP 2004-212630, filed Jul. 21, 2004 and JP 2005-26305, filed Feb. 2, 2005, the entire contents of which are hereby incorporated by reference. This claim for priority benefit is being filed concurrently with the filing of this application.

BACKGROUND OF THE INVENTION

1. Technical Field of the Invention

The present invention relates to a solid-state imaging device including plural groups of photoelectric conversion devices.

2. Description of the Related Art

In the related art, as a measure to make a shading correction of a peripheral portion of a solid-state imaging device of the CCD or CMOS type, the center of the aperture of each photodiode and the center of a microlens mounted above the photodiode are shifted more in going from the center of the solid-state imaging device toward the peripheral portion (known as microlens shifting). In another related art structure, the arrangement of a light shielding layer or color filters present between a photodiode array and a microlens array has been shifted (e.g., see JP-A-2002-170944 and JP-A-10-229180). In a further related art structure, the aperture of each photodiode is increased in going from the center toward the peripheral portion.

In the above-described related art shading correction, the incident angle at which light is incident to the peripheral portion of the solid-state imaging device is fixed. The amount of shift of the microlens is determined such that an optimum shading correction is made when light enters at that incident angle. In an imaging apparatus provided with a zoom lens or the like, the angle at which light is incident to the peripheral portion of the solid-state imaging device varies according to the position of the zoom lens. Therefore, it is difficult to obtain a sufficient effect with the countermeasure as described above.

SUMMARY OF THE INVENTION

It is an object of the present invention to provide a solid-state imaging device capable of obtaining high-quality images in which shading has been reduced without being affected by variation of the incident angle at which light is incident to a peripheral portion.

A solid-state imaging device according to the present invention includes a plurality of groups of photoelectric conversion devices. The solid-state imaging device is so constructed that the difference between the amount of light incident to each photoelectric conversion devices in a peripheral portion and the amount of light incident to each photoelectric conversion device in a central portion decreases. Any of groups of photoelectric conversion devices out of the plural groups of photoelectric conversion devices are so constructed that the difference between the amount of light incident to each photoelectric conversion device in the peripheral portion and the amount of light incident to each photoelectric conversion device in the central portion is reduced to a minimum depending on an light incident angle to the peripheral portion of the solid-state imaging device.

Because of this configuration, if the incident angle at which light is incident to the peripheral portion of the solid-state imaging device varies, high-quality images in which shading has been reduced can be obtained.

In another aspect of the solid-state imaging device according to the present invention, the plural kinds of photoelectric conversion devices include first and second groups of photoelectric conversion devices. The first groups of photoelectric conversion devices are so constructed that the aforementioned difference is reduced to a minimum in a case where the incident angle at which light is incident to the peripheral portion of the solid-state imaging device is less than a given angle. The second groups of photoelectric conversion devices are so constructed that the difference is reduced to a minimum in a case where the incident angle at which light is incident to the peripheral portion of the solid-state imaging device is greater than a given angle.

In a further aspect of the solid-state imaging device according to the present invention, the positions of microlenses mounted above the photoelectric conversion devices of the first and second groups which are in the peripheral portion are shifted by an amount toward the central portion relative to the positions of the photoelectric conversion devices. The amount of shift of the microlenses mounted above the second groups of photoelectric conversion devices is greater than the amount of shift of the microlenses mounted above the first groups of photoelectric conversion devices.

In one aspect of the solid-state imaging device of the present invention, an array of the plural kinds of photoelectric conversion devices forms a repetitive pattern.

An imaging apparatus of the present invention images a subject and has the aforementioned solid-state imaging device and drive control unit for driving and controlling the solid-state imaging device.

In one aspect of the imaging apparatus of the present invention, the drive control unit performs drive and control for reading out only signals corresponding to electric charges stored in photoelectric conversion devices of a kind that minimizes the aforementioned difference, based on the incident angle at which light is incident to the peripheral portion of the solid-state imaging device during moving picture photography.

Because of this structure, during moving picture photography, a signal can be read out only from the group of photoelectric conversion devices which minimizes the difference between the amount of light incident to the photoelectric conversion devices in the peripheral portion and the amount of light incident to the photoelectric conversion devices in the central portion. Accordingly, if the incident angle at which light is incident to the peripheral portion of the solid-state imaging device varies, high-quality moving pictures in which shading has been reduced can be obtained.

In another aspect of the imaging apparatus of the present invention, the drive control unit performs drive and control for reading out signals corresponding to electric charges stored in the plural groups of photoelectric conversion devices during still picture photography. There is further provided shading correction unit for making a shading correction of the signals using a first signal read from the group of photoelectric conversion devices designed to minimize the difference during the still picture photography and a second signal read from groups of photoelectric conversion devices other than that group of photoelectric conversion devices out of the signals read out.

Because of this structure, high-quality still pictures in which shading has been reduced can be obtained.

In a further aspect of the imaging apparatus of the invention, the shading correction unit makes the shading correction by taking an average of the first and second signals.

Because of this structure, high-quality still pictures in which shading has been reduced can be obtained.

In a yet other aspect of the imaging apparatus of the present invention, the shading correction unit makes the shading correction by finding accumulated values of the first and second signals existing in the plural parts extracted by dividing an area in which the signals are mapped, and multiplying the second signal existing in the plural parts by such a gain as to make the accumulated value of the second signal equal to the accumulated value of the first signal.

Because of this structure, high-quality still pictures in which shading has been reduced can be obtained without deteriorating the resolution.

According to the present invention, a solid-state imaging device can be offered which is capable of obtaining high-quality images in which shading has been reduced without depending on variation of the incident angle at which light is incident to the peripheral portion.

DETAILED DESCRIPTION OF THE INVENTION

Figure 1:
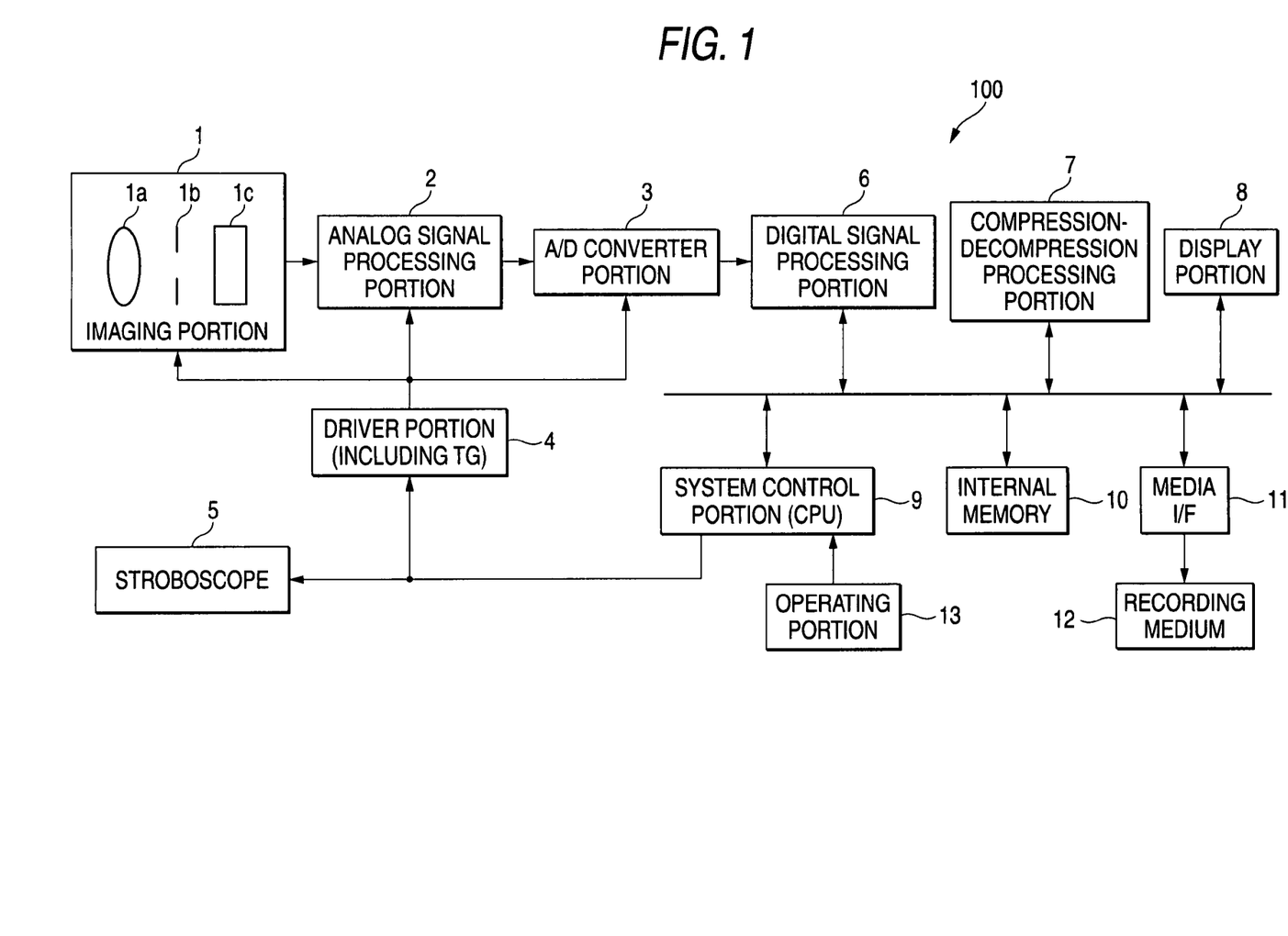
FIG. 1 is a schematic block diagram of a digital camera that is one example of an imaging apparatus, illustrating one embodiment of the present invention.

FIG. 1 schematically shows the structure of a digital camera that is one example of an imaging apparatus, illustrating an embodiment of the present invention.

The digital camera, generally indicated by reference numeral 100, shown in FIG. 1 has an imaging portion 1, an analog signal processing portion 2, an A/D converter portion 3, a driver portion 4, a stroboscope 5, a digital signal processing portion 6, a compression-decompression processing portion 7, a display portion 8, a system control portion 9, an internal memory 10, a media interface 11, a recording medium 12, and a operating portion 13. The imaging portion 1 includes optical system 1a, an aperture 1b, and a solid-state imaging device 1c. The optical system 1a includes a taking lens and a zoom lens. The digital signal processing portion 6, compression-decompression processing portion 7, display portion 8, system control portion 9, internal memory 10, and media interface 11 are connected with a system bus 14.

Figure 2:
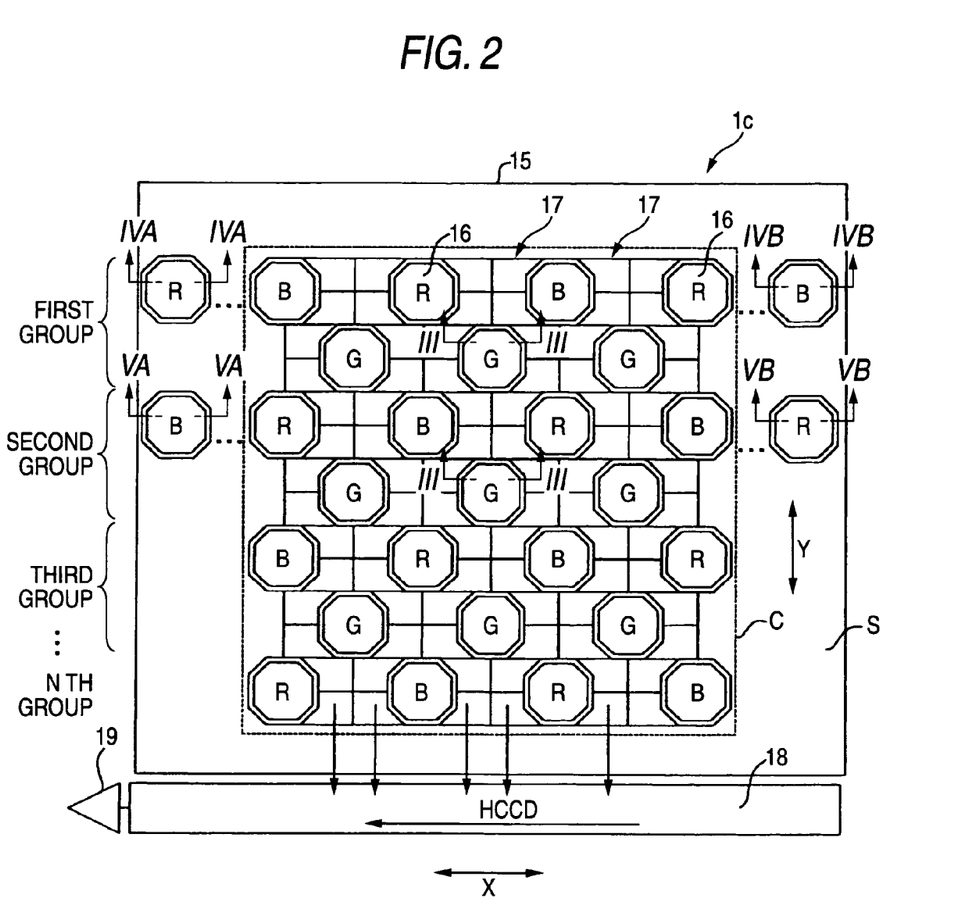
FIG. 2 is a schematic diagram of a solid-state imaging device contained in the imaging portion of the digital camera shown in FIG. 1.

FIG. 2 schematically shows the structure of the solid-state imaging device contained in the imaging portion of the digital camera shown in FIG. 1.

As shown in FIG. 2, the solid-state imaging device 1c includes a plurality of hotoelectric conversion devices 16 disposed in a row direction (indicated by the arrow X) and in a column direction (indicated by the arrow Y orthogonal to the row direction on a semiconductor substrate 15. In the figure. numerals are given to only some of the photoelectric conversion devices. The imaging device 1c further includes a plurality of vertical transfer portions 17 (only parts of which are assigned numerals rizontal transfer (HCCD) portion 18, and an output portion 19.

In the plural photoelectric conversion devices 16, the even rows of photoelectric conversion elements are shifted about a half of row-direction pitch between the photoelectric conversion devices 16 with respect to the odd rows of conversion elements. That is, a so-called honeycomb arrangement is adopted. The photoelectric conversion devices 16 may not be in a honeycomb arrangement but may be arranged like square lattices on the semiconductor substrate 15.

The photoelectric conversion devices 16 produce and store signal charges corresponding to the amount of incident light and are photodiodes, for example. A color filter (not shown) of red (R), green (G), or blue (B) is mounted above each of the photoelectric conversion devices 16. In FIG. 2, symbols of R, G, and B are attached in a corresponding manner to each photoelectric conversion device 16. A microlens (not shown) is mounted above the color filter.

The vertical transfer portions 17 read out signal charges stored in the photoelectric conversion devices 16 and transfer the charges in the column direction. The vertical transfer portions are mounted at sides of the columns of the photoelectric conversion devices 16 in a corresponding manner to the columns.

The horizontal transfer portion 18 transfers signal charges transferred from the plural vertical transfer portions 17 in the row direction. The output portion 19 outputs signals (hereinafter referred to also as imaging signals) corresponding to the signal charges transferred from the horizontal transfer portion 18.

In the configuration of FIG. 2, signals corresponding to signal charges stored in the photoelectric conversion devices 16 are taken to the outside by CCDs. Alternatively, signals corresponding to signal charges stored in the photoelectric conversion devices 16 may be read out by a MOS circuit, and the signals may be taken to the outside by readout electrodes formed on the semiconductor substrate 15.

It is assumed that two rows of photoelectric conversion devices adjacent to each other in the column direction form one group of photoelectric conversion devices in the solid-state imaging device 1c. The first to Nth groups of photoelectric conversion devices are arranged in the column direction.

The area above the semiconductor substrate 15 of the solid-imaging device 1c can be divided into a central area C in which light from the subject substantially vertically enters and shading is less likely to occur (portion surrounded by the broken line in FIG. 2) and a peripheral portion S in which light from the subject obliquely enters and shading is likely to occur (portion not surrounded by the broken line in FIG. 2).

A related art shading correction (e.g., microlens shifting) is used in the solid-state imaging device 1c. The difference between the amount of light incident to each photoelectric conversion device 16 in the peripheral portion S and the amount of light incident to each photoelectric conversion device 16 in the central portion C is reduced. It is to be noted, however, that the microlenses are not shifted under the same conditions for all the photoelectric conversion devices 16. The microlenses are shifted under conditions different between the odd-numbered groups of photoelectric conversion devices and the even-numbered groups of photoelectric conversion devices.

Figure 3:
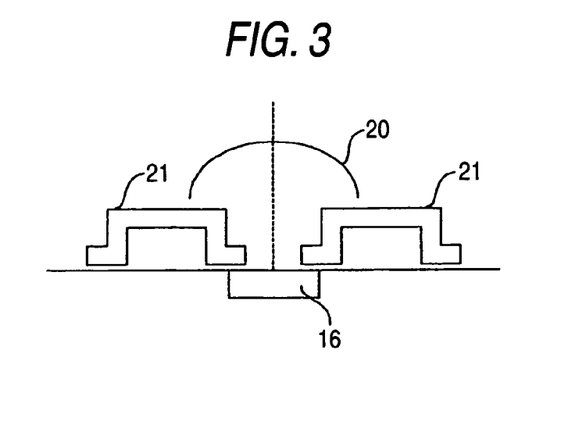
FIG. 3 is a cross-sectional view of a photoelectric conversion device present in the central portion of the solid-state imaging device shown in FIG. 2.
Figure 4A:
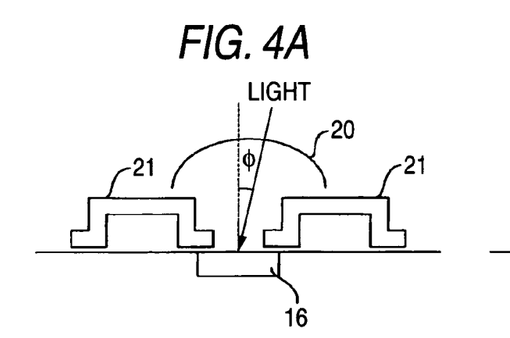
FIGS. 4A and 4B show cross-sections of photoelectric conversion devices in the peripheral portion of the odd-numbered groups of photoelectric conversion devices of the solid-state imaging device shown in FIG. 2.
Figure 4B:
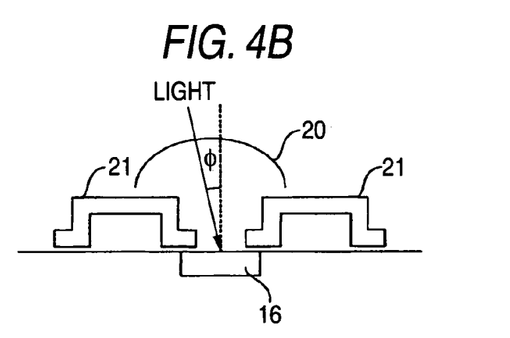
Figure 5A:
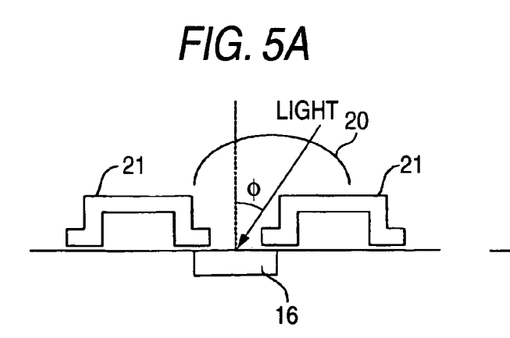
FIGS. 5A and 5B show cross-sections of photoelectric conversion devices in the peripheral portion of the even-numbered groups of photoelectric conversion devices of the solid-state imaging device shown in FIG. 2.
Figure 5B:
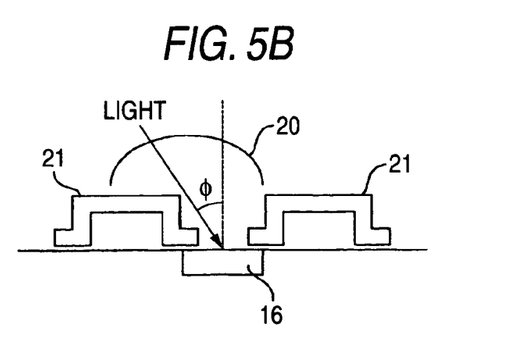

FIG. 3 is a cross-sectional view of the photoelectric conversion in the central portion of the solid-state imaging device shown in FIG. 2, taken on line III-III of FIG. 2. FIGS. 4A and 4B are cross-sectional views of one photoelectric conversion device in the peripheral portion of the odd-numbered groups of photoelectric conversion devices of the solid-state imaging device shown in FIG. 2. FIG. 4A is a cross-sectional view taken on line IVA-IVA of FIG. 2. FIG. 4B is a cross-sectional view taken on line IVB-IVB of FIG. 2. FIGS. 5A and 5B are cross-sectional views of one photoelectric conversion device in the peripheral portion of the even-numbered groups of photoelectric conversion devices of the solid-state imaging device shown in FIG. 2. FIG. 5A is a cross-sectional view taken on line VA-VA of FIG. 2. FIG. 5B is a cross-sectional view taken on line VB-VB of FIG. 2. In FIGS. 3 to 5, components which are identical with their respective counterparts of FIG. 2 are indicated by the same reference numerals as in FIG. 2. In FIGS. 3 to 5, a microlens 20 is mounted above each photoelectric conversion device 16. A light-shielding film 21 shields the vertical transfer portions 17 from light.

As shown in FIG. 3, the center of the aperture of the photoelectric conversion device 16 in the central portion C of the solid-state imaging device 1c is exactly coincident with the center of the microlens 20 located above the photoelectric conversion device 16.

As shown in FIG. 4, in the peripheral portion S of the odd-numbered groups of photoelectric conversion devices, the position of the inicrolens 20 located above the photoelectric conversion device 16 is shifted toward the central portion C. The center of the aperture of the photoelectric conversion device 16 is not coincident with the center of the microlens 20 located above the photoelectric conversion device 16. The amount of shift of the position of the microlens 20 is set to an optimum value such that in a case where the angle of incidence at which light is incident on the peripheral portion S of the solid-state imaging device 1c is less than a given angle of incidence, the difference between the amount of light incident on each photoelectric conversion device 16 in the peripheral portion S of the odd-numbered groups of photoelectric conversion devices and the amount of light incident on the photoelectric conversion device 16 in the central portion C of the odd-numbered groups of photoelectric conversion devices is reduced to a minimum out of the all groups of the photoelectric conversion devices. The angle $\phi$ of incidence of light incident on the peripheral portion S of the solid-state imaging device 1c is taken based on a direction (up-and-down direction in FIG. 4) vertical to the photoelectric conversion device 16. The odd-numbered groups of photoelectric conversion devices correspond to the first groups of photoelectric conversion devices recited in some claims.

As shown in FIG. 5, in the peripheral portion S of the even-numbered groups of photoelectric conversion devices, the position of the microlens 20 located above the corresponding photoelectric conversion device 16 is shifted toward the central portion C. The, center of the aperture of the photoelectric conversion device 16 is not coincident with the center of the microlens 20 located above the photoelectric conversion device 16. The amount of shift of the microlens 20 is set to an optimum value such that in a case where the angle of incidence at which light is incident to the peripheral portion S of the solid-state imaging device 1c to is greater than a given angle of incidence, the difference between the amount of light incident to each photoelectric conversion device 16 in the peripheral portion S of the even-numbered groups of photoelectric conversion devices and the amount of light incident to the photoelectric conversion device 16 in the central portion C of the even-numbered groups of photoelectric conversion devices is reduced to a minimum out of the all groups of the photoelectric conversion devices. The amount of shift of the microlens 20 toward the central portion C in the peripheral portion S of the even-numbered groups of photoelectric conversion devices is greater than the amount of shift of the microlens 20 toward the central portion C in the peripheral portion S of the odd-numbered groups of photoelectric conversion devices. The even-numbered groups of photoelectric conversion devices correspond to the second groups of photoelectric conversion devices recited in some claims.

One example of the case where the incident angle at which light is incident to the peripheral portion S of the solid-state imaging device 1c is greater than the given angle is a case where the zoom lens contained in the optical system 1a is at the wide lens terminal. One example of the case where the incident angle at which light is incident to the peripheral portion S of the solid-state imaging device 1c is greater than the given angle is a case where the zoom lens contained in the optical system 1a at the telescope terminal. The incident angle at which light is incident to the peripheral portion S of the solid-state imaging device 1e varies depending on the state of the aperture 1b, as well as on the position of the zoom lens.

In the above description, only the position of the microlens 20 is mentioned. The positions of the color filters and the light shielding film 21 may be shifted in a corresponding manner to the position of the microlens.

Furthermore, in the above description, a shading correction is made by shifting of the microlens. This may also be carried out by enlarging the aperture of each photoelectric conversion device 16. In this case, the sizes of the apertures of the photoelectric conversion devices 16 in the peripheral portion S may be set to optimum values for the odd-numbered groups of photoelectric conversion devices and the even-numbered groups of photoelectric conversion devices.

Referring back to FIG. 1, the analog signal processing portion 2 performs given signal processing on an imaging signal obtained by the imaging portion 1. The A/D converter portion 3 converts this processed analog signal into a digital signal. The output from the A/D converter portion 3 is sent to the digital signal processing portion 6.

During photography, the optical system 1a and aperture 1b are controlled via the driver portion 4. When a release button (not shown) that is apart of the operating portion 13 is operated, a release switch (not shown) is turned ON. At this moment, the solid-state imaging device 1c is driven by a driver signal from a timing generator (indicated by TG in FIG. 1) contained in the driver portion 4 at giving timing. The driver portion 4 outputs a given driver signal under control of the system control portion 9.

The digital signal processing portion 6 performs digital signal processing on the imaging signal from the A/D converter portion 3 according to a mode of operation (e.g., moving picture mode or still picture mode) set by the operating portion 13. The kinds of processing performed by the digital signal processing portion 6 include black-level offset correction, linear matrix correction, white balance adjustment, gamma correction, image synthesis, synchronization, and composite to Y/C conversion. The digital signal processing portion 6 is made of a DSP, for example.

The compression-decompression processing portion 7 compresses the Y/C data obtained by the digital signal processing portion 6 and decompresses the compressed image data obtained from the recording medium 12.

The display portion 8 is constructed to include an LCD display, for example. An image based on image data which is obtained by performing photography and digital signal processing is displayed on the display portion 8. An image based on image data which is obtained by decompressing the compressed image data recorded on the recording medium 12 is also displayed. Furthermore, through images (unprocessed images) used during photography, various states of the digital camera, and information about manipulations can be displayed.

The internal memory 10 consists, for example, of a DRAM, and is used as a working memory for the digital signal processing portion 6 or for the system control portion 9. In addition, the internal memory is used as a buffer memory for temporarily storing photographed image data recorded on the recording medium 12 or as a buffer memory for image data to be displayed on the display portion 8. The media interface 11 performs inputting and outputting of data with the recording medium 12 such as a memory card.

The operating portion 13 is used to perform various manipulations when the digital camera is used.

The system control portion 9 consists mainly of a processor operated by a given program. The control portion controls and manages the operation of the whole digital camera 100 including photography operation.

Figure 6:
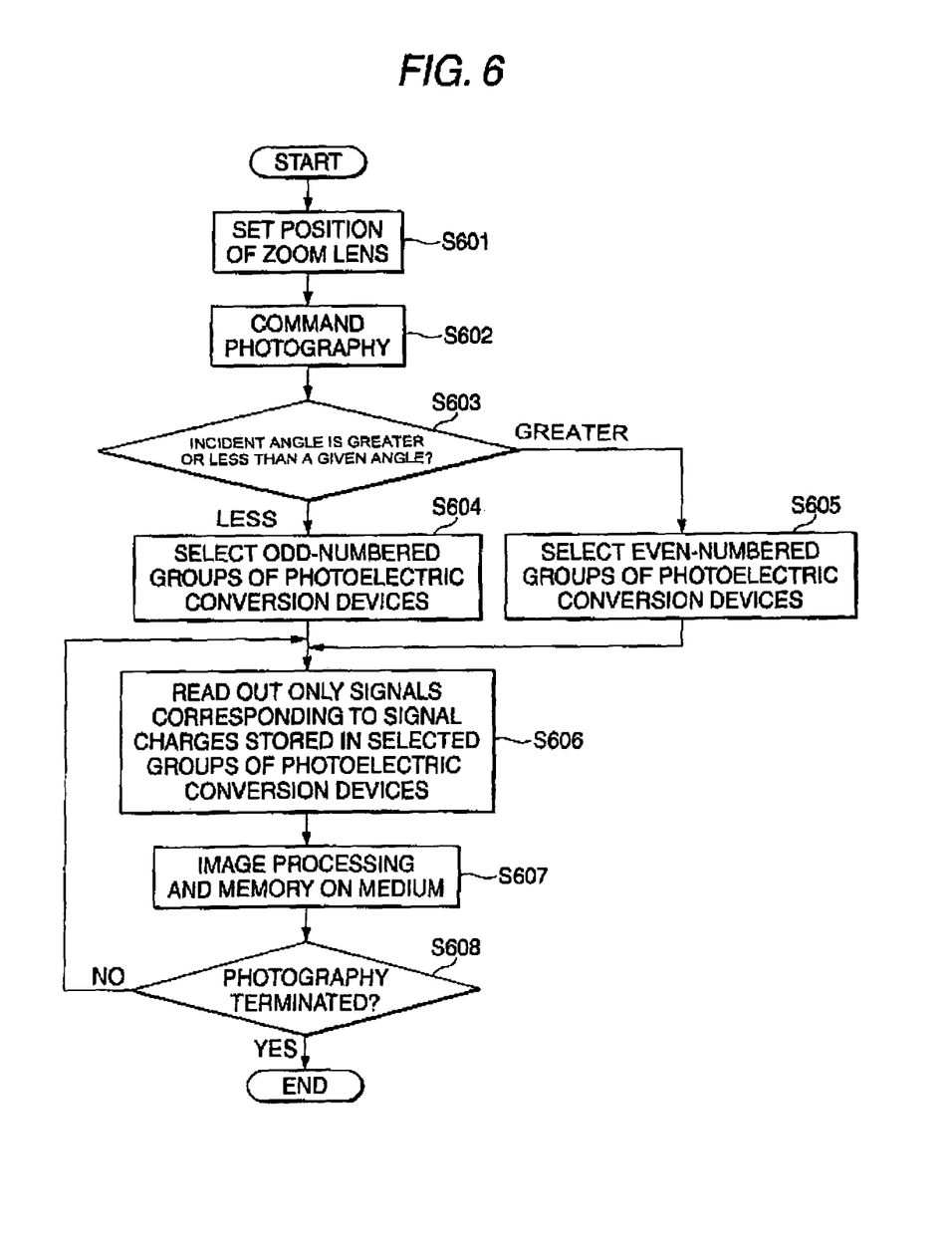
FIG. 6 is a flowchart illustrating a sequence of operations of the digital camera during moving picture photography, illustrating an embodiment of the invention.

The operation of the digital camera 100 during moving picture photography is next described. FIG. 6 is a flowchart illustrating a sequence of operations of the digital camera during moving picture photography, depicting an embodiment of the present invention.

First, the operating portion 13 is operated to set the digital camera 100 to moving picture mode. The position of the zoom lens is set by a user's manipulation (S601). If the release button is depressed to command photography (S602), the system control portion 9 judges the incident angle at which light is incident to the peripheral portion S of the solid-state imaging device 1c (S603). Where the zoom lens is set to the wide lens terminal, for example, the system control portion 9 determines that the incident angle at which light is incident to the peripheral portion S of the solid-state imaging device 1c is less than a given angle (less in S603), and the control portion selects the odd-numbered groups of photoelectric conversion devices which have been shading-corrected optimally for angles which are less than a given angle (S604). On the other hand, where the zoom lens is set to the telescope terminal, the system control portion 9 determines that the incident angle at which light is incident to the peripheral portion S of the solid-state imaging device 1c is greater than a given angle (greater in S603), and the control portion selects the even-numbered groups of photoelectric conversion devices which have been shading-corrected optimally for angles greater than a given angle (S605).

After the selection of groups of photoelectric conversion devices, the system control portion 9 issues an instruction to the driver portion 4 to read out only a signal corresponding to the signal charges stored in the selected groups of photoelectric conversion devices. The driver portion 4 provides imaging control according to the instruction and reads out only a signal corresponding to the signal charges stored in the selected groups of photoelectric conversion devices (S606). The imaging signal read out passes through the analog signal processing portion 2 and then through the A/D converter portion 3. In the digital signal processing portion 6, given digital signal processing is performed. The signal is compressed by the compression-decompression processing portion 7 and recorded on the recording medium 12 (S607).

The processing of S606 and S607 is repeatedly carried out at a given frame rate until the release button is again depressed and an instruction for terminating the photography is given. When the instruction for terminating the photography is given (YES in S608), the digital camera 100 is put in a waiting state.

As described so far, according to the digital camera 100 during moving picture photography, in a case where the incident angle at which light is incident to the peripheral portion S of the solid-state imaging device 1c is less than a given angle, processing for reading out only signals corresponding to signal charges stored in the odd-numbered groups of photoelectric conversion devices which have been shading-corrected optimally for incident angles which are less than a given angle. Therefore, the image quality of moving pictures taken under photography conditions where the incident angle is less than a given angle can be improved. Where the incident angle of light is incident to the peripheral portion S of the solid-state imaging device 1c is greater than a given angle, processing for reading out only signals corresponding to signal charges stored in the even-numbered groups of photoelectric conversion devices which have been shading-corrected optimally for incident angles greater than given angle is performed. Consequently, the image quality of moving pictures taken under photography conditions where the incident angle is greater than a given angle can be improved. In this way, according to the digital camera 100, moving pictures less deteriorated in image quality can be obtained even in a case where the incident angle at which light is incident to the peripheral portion S of the solid-state imaging device 1c varies.

Furthermore, according to the digital camera 100, the above-described effect can be obtained by directly utilizing thinning performed by a general digital camera during moving picture photography.

In the case of the above-described embodiment, the solid-state imaging device comprising two kinds of groups of photoelectric conversion devices are described as an example. That is, groups of photoelectric conversion devices shading-corrected optimally for the case where the incident angle at which light is incident to the peripheral portion S of the solid-state imaging device 1c is less than a given angle and groups of photoelectric conversion devices shading-corrected optimally for the case where the incident angle at which light is incident to the peripheral portion S of the solid-state imaging device 1c is greater than a given angle. The number of kinds of photoelectric conversion devices is not limited to two. The number of kinds of photoelectric conversion devices may be three or more.

For example, the case of angles less than a given angle is divided into a first angle and a second angle (the first angle<the second angle). The case of angles greater than a given angle is divided into a third angle and a fourth angle (the third angle>the fourth angle). Let n be a positive integer. For instance, the (4n+1)th group of photoelectric conversion devices is shading-corrected optimally for the case where the incident angle is the third angle. The (4n+2)th group of photoelectric conversion devices is shading-corrected optimally for the case where the incident angle is the second angle. The (4n+3)th group of photoelectric conversion devices is shading-corrected optimally for the case where the incident angle is the third angle. The (4n+4)th group of photoelectric conversion devices is shading-corrected optimally for the case where the incident angle is the fourth angle. During moving picture photography, the incident angle is judged according to the position of the zoom lens, the groups of photoelectric conversion devices which have been shading-corrected optimally for the case of the judged incident angle is selected, and processing for reading out only a signal corresponding to signal charges stored in the groups of photoelectric conversion devices is performed. In this way, if the zoom lens is located midway between the telescope terminal and the wide lens terminal, moving pictures can be obtained without sacrificing the image quality.

In the above-described embodiment, two rows of photoelectric conversion devices that are adjacent to each other in the column direction are treated as one group of photoelectric conversion devices. This is determined only by the arrangement of the color filters. For example, in a case where R, G, and B of the color filter array are contained in each row of photoelectric conversion devices, one row of photoelectric conversion devices may be treated as one group of photoelectric conversion devices. Additionally, more than two rows of photoelectric conversion devices may be treated as one group of photoelectric conversion devices.

Furthermore, in the above-described embodiment, two kinds of groups of photoelectric conversion devices are alternately arranged in the column direction. The column-direction arrangement of the two kinds of photoelectric conversion devices is only required to form a repetitive pattern.

Figure 7:
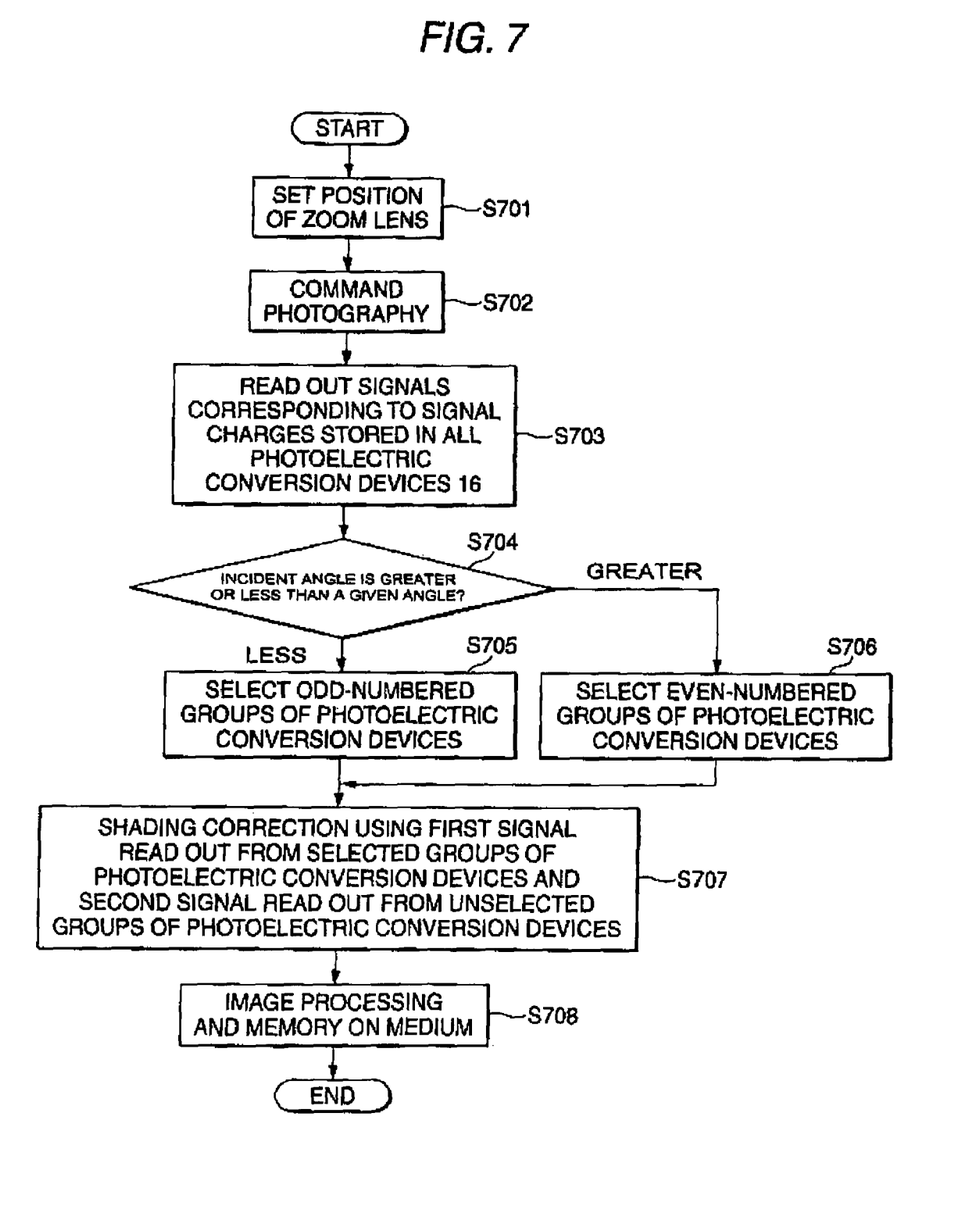
FIG. 7 is a flowchart illustrating a sequence of operations of a digital camera during still picture photography, illustrating an embodiment of the invention.

The operation of the digital camera 100 during still picture photography is next described. FIG. 7 is a flowchart illustrating a sequence of operations of the digital camera during still picture photography, depicting an embodiment of the present invention.

First, the operating portion 13 is operated to set the digital camera 100 to still picture mode. The position of the zoom lens is set by a user's manipulation (S701). If the release button is depressed to command photography (S702), the system control portion 9 issues an instruction to the driver portion 4 such that a signal corresponding to signal charges stored in all the photoelectric conversion devices 16 of the solid-state imaging device 1c is read out. The driver portion 4 provides imaging control according to the instruction and reads out a signal corresponding to signal charges stored in all the photoelectric conversion devices 16 (S703). The imaging signal read out passes through the analog signal processing portion 2 and through the A/D converter portion 3 and is temporarily stored in the internal memory 10 via the system bus 14.

The system control portion 9 then judges the incident angle at which light is incident to the peripheral portion S of the solid-state imaging device 1c during still picture photography (S704). Where the zoom lens is set to the wide lens terminal, for example, in step S701, the system control portion 9 determines that the incident angle at which light is incident to the peripheral portion S of the solid-state imaging device 1c is less than a given angle (less in S704), and the control portion selects the odd-numbered groups of photoelectric conversion devices which have been shading-corrected optimally for incident angles less than a given angle (S705). On the other hand, where the zoom lens is set to the telescope terminal in step S701, the system control portion 9 determines that the incident angle at which light is incident to the peripheral portion S of the solid-state imaging device 1c is greater than a given angle (in S704), and the control portion selects the even-numbered groups of photoelectdc conversion devices which have been shading-corrected optimally for incident angles greater than a given angle (S706).

After the selection of the groups of photoelectric conversion devices, the digital signal processing portion 6 makes a shading correction of the signal read out in step S703, using the first signal read out from the groups of photoelectric conversion devices selected from the system control portion 9 and the second signal read out from the groups of photoelectric conversion devices not selected by the system control portion 9 out of the signals read out in step S703 (S707). The shading-corrected signal is subjected to given digital signal processing in the digital signal processing portion 6. The signal is compressed by the compression-decompression processing portion 7 and then recorded on the recording medium 12 (S708) The digital camera 100 is put in a waiting state.

The aforementioned shading correction can be made, for example, by the following two methods.

(First Shading Correction)

The digital signal processing portion 6 takes an average of the first and second signals to thereby perform a shading correction. That is, the digital signal processing portion 6 finds the average value of the first and second signals in the column direction, the signals being read out from two groups of photoelectric conversion devices which are adjacent to each other in the column direction. As a result, it is possible to create a signal that is in a state between the first signal in which shading has been sufficiently reduced by microlens shifting and the second signal in which shading has not been sufficiently reduced by microlens shifting. Where no shading correction is made, bright and dark portions will be alternately produced in the column direction in the peripheral portion of the image based on the imaging signal read out in step S703. Therefore, shading will become noticeable. However, the aforementioned shading correction can make the shading less noticeable though the resolution is deteriorated.

(Second Shading Correction)

The digital signal processing portion 6 divides an area onto which the signals stored in the internal memory 10 into 64 parts, for example. The first signal is averaged over all the parts (accumulated value of the brightness signal) Furthermore, the second signal is averaged over all the parts of the area. The digital signal processing portion 6 performs a shading correction by multiplying the second signal in each part of the area by a gain that makes the averaged second signal equal to the averaged first signal. In this way, the brightness of the second signal in which shading is not sufficiently reduced is matched to the brightness of the first signal in which shading has been sufficiently reduced. Consequently, the shading can be reduced sufficiently without deteriorating the resolution, unlike the first shading correction.

As described previously, where there are four kinds of photoelectric conversion devices, a shading correction is made using the first and second signals. The first signal is read out from the selected groups of photoelectric conversion devices. The three second signals are read out from the three groups of photoelectric conversion devices not selected in step S707. The shading correction is carried out, for example, by adding up all the first signal and three second signals and dividing the sum by four. Alternatively, the shading correction is performed by multiplying each of the three second signals by a gain that makes the area-averaged value of each of the three second signals equal to the area-averaged value of the first signal.

What is claimed is:

1. A solid-state imaging device comprising:
   plural groups of photoelectric conversion devices formed on a semiconductor substrate, said plural groups comprising:
   plural first groups of photoelectric conversion devices comprising adjacent plural rows of photoelectric conversion devices and including red, green and blue color filters; and plural second groups of photoelectric conversion devices which are alternately formed with said plural first groups of photoelectric conversion devices, said plural second groups comprising adjacent plural rows of photoelectric conversion devices and including red, green and blue color filters; and plural microlenses formed on said first and second groups of photoelectric conversion devices, said plural microlenses being shifted in a peripheral portion of the solid-state imaging device to decrease a difference between an amount of incident light that is incident on a photoelectric conversion device in said peripheral portion of said imaging device and an amount of incident light that is incident on a photoelectric conversion device in a central portion of said imaging device, wherein in said peripheral portion of the solid-state imaging device, the microlenses formed on said plural first groups are shifted by a first amount and the microlenses formed on said plural second groups are shifted by a second amount which is greater than said first amount.

2. The solid-state imaging device according to claim 1, wherein said shifted microlenses are shifted in said first groups such that a first difference between said amounts of incident light for said first groups comprises the least amount of difference among said plural groups in a case where the incident angle at which light is incident on the peripheral portion of the solid-state imaging device comprises a first angle, and wherein said shifted microlenses are shifted in said second groups such that a second difference between said amounts of incident light for said second groups comprises the least amount of difference among said plural groups in a case where the incident angle at which light is incident on the peripheral portion of the solid-state imaging device comprises a second angle that is different than said first angle.

3. The solid-state imaging device according to claim 2, wherein said microlenses which are in the peripheral portion are shifted by an amount toward the central portion relative to the positions of the photoelectric conversion devices.

4. The solid-state imaging device according to claim 1, wherein an array of the first groups of photoelectric conversion devices forms a repetitive pattern.

5. An imaging apparatus, comprising:
a solid state imaging device, comprising:
plural groups of photoelectric conversion devices formed on a semiconductor substrate, said plural groups comprising:
plural first groups of photoelectric conversion devices comprising adjacent plural rows of photoelectric conversion devices and including red, green and blue color filters; and plural second groups of photoelectric conversion devices which are alternately formed with said plural first groups of photoelectric conversion devices, said plural second groups comprising adjacent plural rows of photoelectric conversion devices and including red, green and blue color filters; and plural microlenses formed on said first and second groups of photoelectric conversion devices, said plural microlenses being shifted in a peripheral portion of the solid-state imaging device to decrease a difference between an amount of incident light that is incident on a photoelectric conversion device in said peripheral portion of said imaging device and an amount of incident light that is incident on a photoelectric conversion device in a central portion of said imaging device; and a drive control unit for driving and controlling the solid-state imaging device, wherein in said peripheral portion of the solid-state imaging device, the microlenses formed on said plural first groups are shifted by a first amount and the microlenses formed on said plural second groups are shifted by a second amount which is greater than said first amount.

6. The imaging apparatus according to claim 5, wherein the drive control unit performs drive control for reading out signals corresponding to electric charges stored in said first groups of photoelectric conversion devices in a case where a first difference between said amounts of incident light for said first groups comprises the least amount of difference among said plural groups during moving picture photography.

7. The imaging apparatus according to claim 5, wherein the drive control unit performs drive control for reading out signals corresponding to electric charges stored in the plural groups of photoelectric conversion devices during still picture photography, and wherein a first difference between said amounts of incident light for said first groups comprises the least amount of difference among said plural groups, and wherein the imaging apparatus further comprises a shading correction unit for making a shading correction of the signals using:
a first signal read from said first groups of photoelectric conversion devices; and
a second signal read from said second groups of photoelectric conversion devices.

8. The imaging apparatus according to claim 7, wherein the shading correction unit makes the shading correction by taking an average of the first and second signals.

9. The imaging apparatus according to claim 7, wherein the shading correction unit makes the shading correction by finding accumulated values of the first and second signals existing in plural parts of an area in which the signals are mapped, and multiplying the second signal existing in the plural parts by such a gain as to make the accumulated value of the second signal equal to the accumulated value of the first signal.

10. The solid-state imaging device according to claim 1, wherein a first difference in said amounts of incident light for the first groups is less than a second difference in said amounts of incident light for the second groups in a case where an incident angle at which light is incident on the peripheral portion of the solid-state imaging device comprises a first angle, and wherein the second difference for the second groups is less than the first difference for the first groups in a case where the incident angle comprises a second angle which is different than said first angle.

11. The solid-state imaging device according to claim 10, wherein a center of a microlens in the plurality of microlenses mounted above the photoelectric conversion devices in the central portion is coincident with a center of an aperture of the photoelectric conversion device, and wherein a center of the microlenses mounted above the photoelectric conversion devices in the peripheral portion is shifted toward the central portion from a center of an aperture of the photoelectric conversion device corresponding the microlens.

12. The solid-imaging device according to claim 1, wherein each group of the plural first groups and the plural second groups comprises two rows of photoelectric conversion devices.

13. The solid-state imaging device according to claim 12, wherein the first and second groups are repeatedly arrayed in a column direction.

14. The solid-state imaging device according to claim 1, wherein the photoelectric conversion devices are arrayed in a honeycomb arrangement.

15. The solid-state imaging device according to claim 1, wherein said plural first groups comprise a difference between an amount of incident light that is incident on a photoelectric conversion device in said peripheral portion of said imaging device and an amount of incident light that is incident on a photoelectric conversion device in a central portion of said imaging device which is a least amount of difference among all of said plural groups.

16. The imaging apparatus according to claim 5, further comprising:
a system control portion for judging the incident angle, said drive control unit performing drive control based on a result of said judging said incident angle.

17. The imaging apparatus according to claim 16, wherein said incident angle varies by varying a setting of a zoom lens of said imaging apparatus between a telescope terminal setting and a wide lens terminal setting.

18. The imaging apparatus according to claim 5, wherein signal charges from the first and second groups of photoelectric conversion devices are at least one of selectively read out and selectively used for shading correction.

19. The solid-state imaging device according to claim 1, wherein a center of a microlens in the plural microlenses mounted above the photoelectric conversion devices in the central portion is coincident with a center of an aperture of the photoelectric conversion device, and a center of the microlenses mounted above the photoelectric conversion devices in the peripheral portion is shifted toward the central portion from a center of an aperture of the photoelectric conversion device corresponding the microlens,
wherein the plural photoelectric conversion devices are arrayed in a honeycomb arrangement, and each group of the plural first groups and the plural second groups comprises a row of photoelectric conversion devices having green color filters and a row of photoelectric conversion devices having red and blue color filters,
wherein said amount of shift of said plural microlenses is set to an optimum value such that:
in a case where an angle of incidence at which light is incident on said peripheral portion of said imaging device is less than a predetermined angle, a difference between an amount of light incident on said plural first groups in said peripheral portion of said imaging device and an amount of light incident on said plural first groups in said central portion of said imaging device comprises a least amount of difference among said plural groups of photoelectric conversion devices, and
in a case where an angle of incidence at which light is incident on said peripheral portion of said imaging device is greater tan a predetermined angle, a difference between an amount of light incident on said plural second groups in said peripheral portion of said imaging device and an amount of light incident on said plural second groups in said central portion of said imaging device comprises the least amount of difference among said plural groups of photoelectric conversion devices.

20. An imaging apparatus, comprising:
a solid-state imaging device comprising:
plural first groups of photoelectric conversion devices comprising adjacent plural rows of photoelectric conversion devices and including red, green and blue color filters;
plural second groups of photoelectric conversion devices which are alternately formed with said plural first groups of photoelectric conversion devices, said plural second groups comprising adjacent plural rows of photoelectric conversion devices and including red, green and blue color filters; and
plural microlenses formed on said first and second groups of photoelectric conversion devices, said plural microlenses being shifted in a peripheral portion of the solid-state imaging device to decrease a difference between an amount of incident light that is incident on a photoelectric conversion device in said peripheral portion of said imaging device and an amount of incident light that is incident on a photoelectric conversion device in a central portion of said imaging device, the microlenses on said plural first groups being shifted by a first amount and the microlenses on said plural second groups being shifted by a second amount which is greater than said first amount in said peripheral portion of the solid-state imaging device; and
a control portion that judges an incident angle at which light is incident on said peripheral portion of the imaging device, and:
if an incident angle at which light is incident on said peripheral portion of the imaging device is less than a predetermined angle, selects said first groups photoelectric conversion devices; and
if an incident angle at which light is incident on said peripheral portion of said imaging device is greater tan a predetermined angle, selects said second groups of photoelectric conversion devices.

21. The imaging apparatus of claim 20, further comprising:
a driver portion that reads out signals corresponding to said first and second groups of photoelectric conversion devices; and
a digital signal processing portion that makes a shading correction of said signals that have been read out, by using a first signal which was read out from the selected groups of photoelectric conversion devices which were selected by said control portion and a second signal read out from other groups of photoelectric conversion devices which were not selected by the control portion, said shading correction comprising:
dividing into parts, an area onto which said first and second signals are stored in an internal memory of said imaging apparatus, averaging said first signal over said parts and averaging said second signal over said parts, and performing shading correction by multiplying the second signs in each part of the area by a gain that makes the avenged second signal equal to the averaged first signal.

* * * * *